(12) United States Patent
Roithner et al.

(10) Patent No.: US 6,294,026 B1
(45) Date of Patent: *Sep. 25, 2001

(54) DISTRIBUTION PLATE FOR A REACTION CHAMBER WITH MULTIPLE GAS INLETS AND SEPARATE MASS FLOW CONTROL LOOPS

(75) Inventors: Klaus Roithner, Wappingers Falls, NY (US); Bernhard Poschenrieder, La Celle Saint-Cloud (FR); Karl Paul Muller, Wappingers Falls, NY (US)

(73) Assignees: Siemens Aktiengesellschaft, Munich (DE); International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/756,670

(22) Filed: Nov. 26, 1996

(51) Int. Cl.$^7$ .................................................. C23C 16/00
(52) U.S. Cl. ........................ 118/715; 118/715; 118/719; 156/345
(58) Field of Search ................................. 118/715, 717; 156/345

(56) References Cited

U.S. PATENT DOCUMENTS

| 3,854,443 | * | 12/1974 | Baerg | 118/49 |
| 4,256,053 | | 3/1981 | Dozier | 118/728 |
| 5,453,124 | * | 9/1995 | Moleshi | 118/715 |
| 5,755,886 | * | 5/1998 | Wang | 118/715 |
| 5,781,693 | * | 7/1998 | Ballance | 392/416 |

FOREIGN PATENT DOCUMENTS

| 60-189928 | * | 2/1985 | (JP) | 118/715 |
| 61-5515 | * | 1/1986 | (JP) | 118/715 |
| 63-53932 | * | 3/1988 | (JP) | 118/715 |

* cited by examiner

Primary Examiner—Bruce Bueker
Assistant Examiner—Enn Fieler
(74) Attorney, Agent, or Firm—Donald B. Paschburg

(57) ABSTRACT

The present invention is an apparatus for distributing reactant gases across the substrate mounted in a reaction chamber. The apparatus is capable of being utilized in both vapor deposition and etching processes. The apparatus substantially compensates for the problem of non-uniformity of vapor deposition and etching at the edges of the wafers caused by gas depletion. A gas distribution plate having a plurality of apertures extending therethrough is attached to an interior surface of the reaction chamber. At least one vacuum sealed partition is disposed between a surface of the gas distribution plate and the interior surface of the chamber. The partition separates the space between the plate and reaction chamber into gas distribution zones. A gas inlet is connected to each gas distribution zone. Each gas inlet line has at least one mass flow controller which regulates the flow of gas to each gas distribution zone. The mass flow controllers are utilized to ensure a uniform rate of chemical vapor deposition or etching across the surface of the substrate.

20 Claims, 2 Drawing Sheets

DISTRIBUTION PLATE FOR A REACTION CHAMBER WITH MULTIPLE GAS INLETS AND SEPARATE MASS FLOW CONTROL LOOPS

FIELD OF THE INVENTION

The present invention relates generally to reaction chambers for chemical vapor deposition and dry etching and specifically to an improved apparatus for substantially preventing gas depletion in such reaction chambers.

BACKGROUND OF THE INVENTION

Chemical vapor deposition and etching techniques are utilized in a wide variety of applications. For example, these techniques are used in the manufacture of electrical components. Specifically, chemical vapor deposition and dry etching techniques are used in the manufacture of semiconductor devices and integrated circuits to deposit or etch layers of silicon dioxide and other like material on semiconductor substrates. Chemical vapor deposition is also utilized to impart a reflective or anti-reflective coating to optical devices. In mechanical applications, chemical vapor deposition is employed to impart wear resistant coatings or to impart coatings that increase hardness or reduce friction. In chemical applications, vapor deposition is used to produce barriers to diffusion or as a protection against oxidation or corrosion.

As is well known in the art, chemical vapor deposition and etching techniques comprise a series of sequential steps. First, a source of vapor or vapor material is provided. The source of the vapor material is usually a vapor or a gas, although a solid or liquid material may be utilized if it is first vaporized. Next, the material is transported to a substrate wherein the transportation step may take place in a partial vacuum or a high vacuum. In the transportation step, an important consideration is uniformity of the arrival rate over the substrate. If this step of the process is not properly controlled, uneven or nonuniform film thickness across the substrate can result and produce defective parts. The next step is the reaction of the chemical vapor with the substrate resulting in the deposition of an etching film. The substrate is often heated to increase the reactivity of the substrate for the vapor thereby facilitating the process. The reactants flow over the heated substrate surface and react at the substrate surface to deposit a film or to etch the surface.

In single wafer systems (e.g. for deposition of Si substrate wafers), different effects and particularly gas depletion can lead to non-uniformities across the surface of the substrate, as earlier mentioned. These non-uniformities are frequently manifested by either a differing degree of film deposition or etching near the center of the substrate as compared to the edge. This effect gets more and more severe with increasing diameters of substrate. The effect is particularly pronounced when a Si wafer substrate that approaches or exceeds 300 mm in diameter is employed. Such non-uniformities of film deposition or etching can lead to various problems. For example, in the manufacture of semiconductors and integrated circuits, such non-uniformities can result in devices that do not function or function with less than optimal results.

The prior art has provided various solutions to the problem of nonuniform film deposition or etching at the surface of the substrate. One such solution is to utilize different gas distribution plates or focus rings to compensate for nonuniform film deposition or etching. A disadvantage to this approach is that finding the correct gas distribution plate or focus ring for a particular process can be very time consuming and thus costly. This approach is time consuming because it requires hardware in the reaction chamber to be exchanged. In addition, the appropriate gas distribution plate for a particular process may not be appropriate for another process. Consequently, in order to use the same system for a different process, the user must change the gas distribution plate which results in expensive down time.

It is therefore an objective of the present invention to provide an improved apparatus and method for chemical vapor deposition and dry etching that minimizes the non-uniformity of the deposited film across the surface of a substrate and does so without the use of focusing rings and without the necessity of changing the gas distribution plate.

SUMMARY OF THE INVENTION

The present invention is an apparatus for distributing reactant gases across a substrate which is mounted in a reaction chamber. The apparatus can be used in chemical vapor deposition and dry etching processes. The apparatus substantially compensates for the problem of non-uniformity of vapor deposition and etching at the edges of wafers caused by gas depletion. A gas distribution plate having a plurality of apertures extending therethrough is attached to an interior surface of the reaction chamber. At least one airtight partition is disposed between a surface of the gas distribution plate and the interior surface of the chamber. The partition separates the space between the plate and the reaction chamber into gas distribution zones. A gas inlet line is connected to each gas distribution zone. Each gas inlet line has at least one mass flow controller which regulates the flow of gas to each gas distribution zone. The mass flow controllers are utilized to ensure a uniform rate of chemical vapor deposition or etching across the surface of the substrate.

BRIEF DESCRIPTION OF THE DRAWINGS

For a better understanding of the present invention, reference is made to the following description of an exemplary embodiment thereof, considered in conjunction with the accompanying drawings, in which.

DETAILED DESCRIPTION OF THE INVENTION

Figure 1:
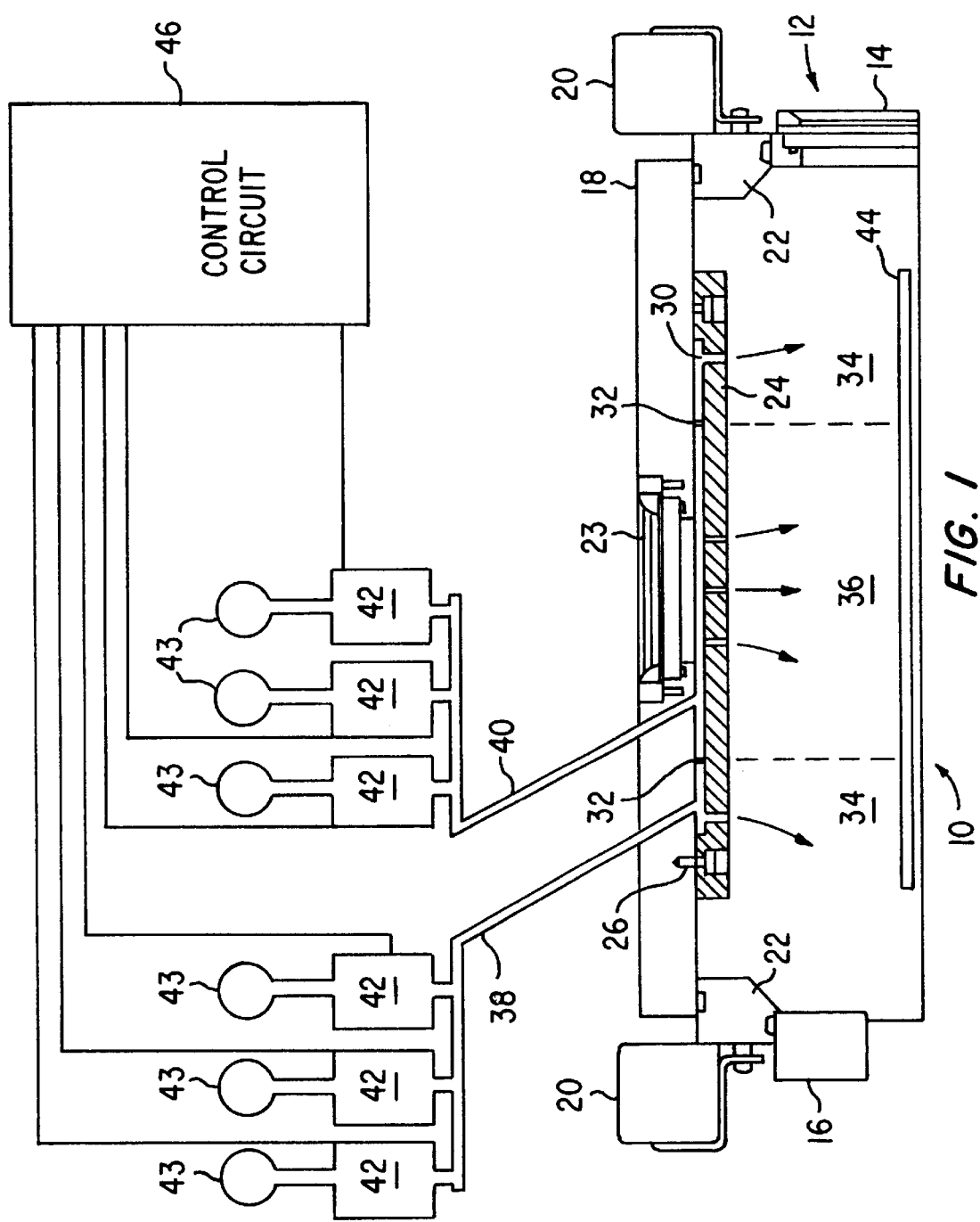
FIG. 1 is a cross-sectional view of the present invention chemical vapor deposition and etching apparatus.

Referring to FIG. 1, the chemical vapor deposition or dry etching apparatus 10 of the present invention is depicted. As is well known in the art, it is frequently desirable to carry out chemical vapor deposition and etching in a partial vacuum or a high vacuum. Therefore, the apparatus includes a reaction chamber 12 having a chamber wall 14 constructed of a strong, rigid material that can be evacuated to lower atmospheric pressures. In those applications where a partial or high vacuums are desired, a vacuum pump 16 is connected to the interior of the chamber 12. To permit easy access into the interior of the reaction chamber, a removable door or hatch 18 is provided. The door 18 is firmly secured to the chamber wall 14 by way of a clamping member 20. Vacuum seals 22 are located between the door 18 and the chamber wall 14 to ensure that the chamber 12 is airtight to enable evacuation. A viewing window 23 may be provided to allow visual contact with the interior of the chamber.

Figure 2:
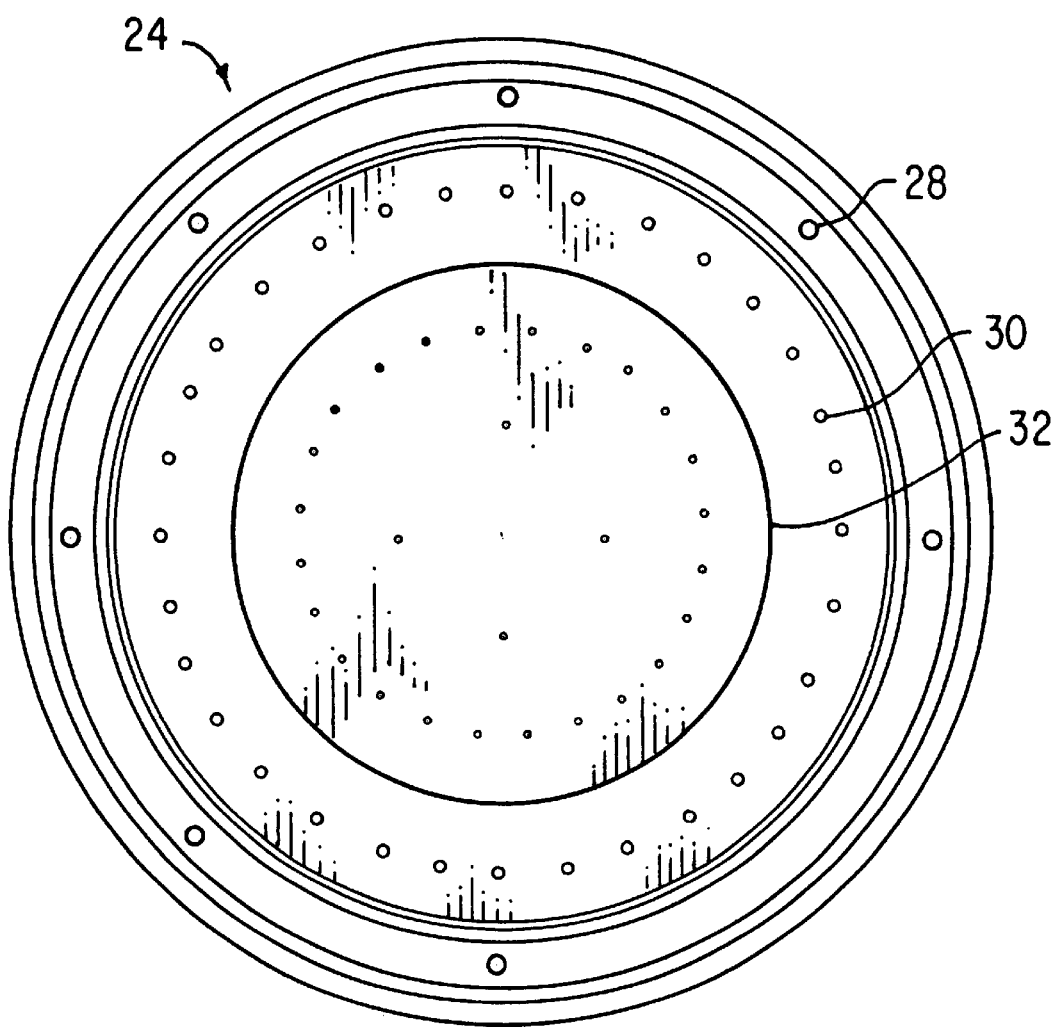
FIG. 2 is a top view of the gas distribution plate of the present invention chemical vapor deposition and etching apparatus.

Referring to FIG. 2 in conjunction with FIG. 1, a gas distribution plate 24 is provided that is attached by way of fasteners such as screws, rivets or other attachment means to any interior surface of the vapor deposition chamber 12. As depicted in the preferred embodiment of FIG. 1, the gas distribution plate 24 is attached to the interior surface of the door 18 of the chamber 12 but it could be attached to another interior surface of the chamber. In the shown embodiment, the fasteners 26 are placed through the fastener holes 28 on the gas distribution plate 24 and attach the gas distribution plate 24 to the door 18. The gas distribution plate 24 is a substantially flat structure that has a top and a bottom surface. In the preferred embodiment, the gas distribution plate 24 is circular although it could be rectangular or any other shape depending on the geometry of the chamber. The gas distribution plate 24 has a plurality of apertures 30 that perforate the gas distribution plate 24. FIG. 2 depicts the apertures 30 arranged as a series of concentric circles, but other arrangements which provide a desirable distribution of vapor across the substrate 44 are within the scope of the invention. A gas-tight partition 32 is disposed between the top surface of the gas distribution plate 24 and the interior surface of the door 18 of the reaction chamber. The partition 32 defines two gas distribution zones 34, 36. In FIG. 1, the two dashed lines depict the separation between the two gas distribution zones 34 and 36. Although FIG. 1 shows one partition 32 creating two gas distribution zones 34 and 36, it is also contemplated that multiple partitions may be provided thereby creating three or more gas distribution zones. In the preferred embodiment, the partition takes the form of a rubber O-ring, but other types of partition structures are also possible. For example, it is contemplated that the partition 32 could be integrally molded into the gas distribution plate 24. Moreover, the partition does not have to be circular. Other shaped partitions can be used so long as they distribute the gas in such a fashion to ensure a uniform rate of reaction across the substrate 44. A uniform rate of reaction is desirable because it ensures a uniform growth rate of a film for the chemical vapor deposition process and a uniform removal rate for the dry etching process. A uniform rate of reaction is produced under ideal conditions by distributing the gas across the substrate 44 in an even distribution. However, due to factors such as uneven temperature or pressure gradients, the gases are required to be distributed across the substrate 44 in an uneven distribution.

Two gas lines 38 and 40 pass through the door 18 and into the reaction chamber 12. One end of each of the gas lines 38 and 40 is connected to each of the gas distribution zones 34 and 36. Therefore, it will be understood that each of the gas lines 38 and 40 supply vapor to each of the gas distribution zones 34 and 36. If more than one partition 32 is provided, it is contemplated that more than two gas lines may be provided. In any case, the other end of the gas lines 38 and 40 are connected to a source of vapor 43 which could be a canister of gas or other suitable source of chemical vapor.

Mass flow controllers, shown in FIG. 1 as reference number 42, are connected to each of the gas lines 38 and 40. The mass flow regulators 42 are typical prior art valves and can operate mechanically, electronically or pneumatically. Each of the mass flow controllers 42 are connected to at least one control circuit 46 which operates to selectively open or close the mass flow controllers 42. Thus, the mass flow controllers 42 are used to regulate the flow of gas through each of the gas lines 38 and 40. Therefore, the mass flow controllers 42 regulate the flow of gas to each of the gas distribution zones 34 and 36. If one type of gas is to be deposited onto the substrate, then one mass flow controller 42 is provided for each gas line 38 and 40. Alternatively, several mass flow controllers 42 may be provided if several different gases are to be supplied to deposit or dry etch onto the substrate.

The chemical vapor deposition and etching apparatus of the present invention operates as follows. A wafer, substrate or work piece 44 is introduced into the reaction chamber 12 and the chamber is closed. If desired, the vacuum pump 16 is employed to reduce the atmospheric pressure within the reaction chamber 12. A source of vapor 43 is provided and connected to the mass flow controllers 42. In etching processes, the vapor is typically Ar, $BCl_3$, $Cl_2$, $CF_3Br$, $CHF_3$, $CF_4$, $C_2F_6$, $C_3F_8$, CO, $CCl_4$, HCl, HBr, $NF_3$, $O_2$ or $SF_6$, but other vapors (gases) are contemplated. The vapor flows through the gas lines 38 and 40, and passes through the apertures 30 of the gas distribution plate 24. The mass flow controllers 42 are selectively controlled using the control circuit 46 to regulate the flow of vapor into each of the gas distribution zones 34 and 36.

The vapor flows over the wafer, substrate or work piece 44 and reacts at or near the surface of the substrate. Using the mass flow controllers 42, the rate of flow of vapor is increased or decreased through each of the gas distribution zones 34 and 35 in order to produce a uniform rate of reaction across the surface of the substrate 44.

It should be understood that the embodiments described herein are merely exemplary and that a person skilled in the art may make variations and modifications to these embodiments utilizing functionally equivalent elements to those described herein. Any and all such modifications as well as others which may be apparent to those skilled in the art are intended to be included within the scope of the present invention as defined by the appended claims.

What is claimed is:

1. A gas distribution apparatus for providing a uniform rate of reaction across a substrate mounted in a reaction chamber comprising:

a substantially planar member having a plurality of apertures extending therethrough and mounting to an interior surface of the reaction chamber to form a cavity between said interior surface and said planar member;

at least one modular partition disposed between a surface of said planar member and the interior surface of the reaction chamber, said at least one partition providing a gas-tight seal between portions of the cavity and separating said apertures into at least two gas distribution zones over said substrate which are operative for distributing reactant gases across the substrate mounted in said reaction chamber; and a gas control circuit for independently regulating a flow of a same reactant gas in each of the at least two gas distribution zones such that a substantially uniform reactant gas distribution is achieved over the substrate.

2. The gas distribution apparatus of claim 1 wherein said partition is an O-ring.

3. The gas distribution apparatus of claim 1 wherein said partition is integrated within said gas distribution plate.

4. The gas distribution apparatus of claim 1 wherein said apertures are arranged as concentric circles.

5. The gas distribution apparatus of claim 1 wherein said planar member is circular.

6. The gas distribution apparatus as recited in claim 2, wherein the O-ring includes rubber.

7. An apparatus for performing chemical vapor deposition and etching comprising:

a reaction chamber;

gas distribution means for distributing a reactant gas over a substrate mounted in said reaction chamber, said gas distribution means having at least one modular rubber partition disposed on a surface thereof for separating said gas distribution means into at least two gas distribution zones over said substrate, said distribution means mounting to an interior surface of the reaction chamber to form a cavity between said interior surface and the planar member;

the at least one partition disposed between a surface of said planar member and the interior surface of the reaction chamber and providing a gas-tight seal between portions of the cavity; and means for regulating the flow of gas into said gas distribution zones including a gas control circuit for independently regulating a flow of a same reactant gas in each of the at least two gas distribution zones such that a substantially uniform reactant gas distribution is achieved over the substrate.

8. The apparatus of claim 7 wherein said means for distributing the reactant gas includes a substantially planar member having a plurality of apertures extending therethrough.

9. The apparatus of claim 8 wherein said planar member is circular.

10. The apparatus of claim 8 wherein said apertures on said planar member are arranged as concentric circles.

11. The apparatus of claim 7 wherein said chamber has an interior surface, and said gas distribution means is affixed to said interior surface so that a space is created between said gas distribution means and said interior surface, said space separated by said partition into said gas distribution zones.

12. The apparatus as recited in claim 7, wherein the partition includes an O-ring.

13. An apparatus for performing chemical vapor deposition and etching comprising:

a reaction chamber having an interior surface;

a plate member attached to said interior surface of said chamber so that a space is created between said plate member and said interior surface of said chamber, said plate member including a plurality of apertures that extend therethrough;

at least one modular partition disposed in said space between said plate member and said interior surface, said partition separating said space into at least two gas distribution zones, the at least one partition providing a gas-tight seal between portions of the space;

a plurality of gas inlet lines, each of said gas inlet lines supplying a same vapor to one of said at least two gas distribution zones; and at least one mass flow controller connected to each of said gas inlet lines, said at least one mass flow controller regulating flow of vapor to each of said gas distribution zones, in accordance with a gas control circuit for independently regulating a flow of the vapor in each of the at least two gas distribution zones such that a substantially uniform reactant gas distribution is achieved over a substrate.

14. The apparatus of claim 13 wherein said reaction chamber is airtight.

15. The apparatus of claim 13 wherein said reaction chamber includes a door to permit access to said reaction chamber.

16. The apparatus of claim 13 further including means for reducing the atmospheric pressure within said reaction chamber.

17. The apparatus of claim 13 wherein said partition is an O-ring.

18. The apparatus of claim 13 wherein said partition is integral with said gas distribution plate.

19. The apparatus of claim 13 wherein said apertures are arranged as concentric circles.

20. The apparatus of claim 17, wherein the O-ring includes rubber.

* * * * *